United States Patent [19]

Fan et al.

[11] Patent Number: 5,116,427
[45] Date of Patent: May 26, 1992

[54] HIGH TEMPERATURE PHOTOVOLTAIC CELL

[75] Inventors: John C. C. Fan, Chestnut Hill; Paul M. Zavracky, Norwood, both of Mass.

[73] Assignee: Kopin Corporation, Taunton, Mass.

[21] Appl. No.: 790,141

[22] Filed: Nov. 7, 1991

Related U.S. Application Data

[60] Continuation of Ser. No. 658,443, Feb. 21, 1991, abandoned, which is a continuation of Ser. No. 424,676, Oct. 20, 1989, abandoned, which is a division of Ser. No. 87,459, Aug. 20, 1987, Pat. No. 4,889,565.

[51] Int. Cl.[5] ............... H01L 31/068; H01L 31/0304
[52] U.S. Cl. .................... 136/259; 136/256; 136/262; 357/30; 357/72; 357/65; 357/67
[58] Field of Search ............ 136/256, 259, 262; 357/30 B, 30 J, 30 Q, 65, 67, 72

[56] References Cited

U.S. PATENT DOCUMENTS

| | | | |
|---|---|---|---|
| 3,436,549 | 4/1969 | Pruett | 250/211 J |
| 3,982,964 | 9/1976 | Lindmayer et al. | 136/256 |
| 4,126,930 | 11/1978 | Moon | 437/5 |
| 4,158,717 | 6/1979 | Nelson | 428/446 |
| 4,197,141 | 4/1980 | Bozler et al. | 136/258 |
| 4,227,941 | 10/1980 | Bozler et al. | 136/255 |
| 4,278,704 | 7/1981 | Williams | 437/201 |
| 4,359,487 | 11/1982 | Schneider | 427/75 |
| 4,366,338 | 12/1982 | Turner et al. | 136/258 |
| 4,367,368 | 1/1983 | Wolf | 136/255 |
| 4,547,622 | 10/1985 | Fan et al. | 136/249 |
| 4,593,152 | 6/1986 | Yamazaki | 136/246 |
| 4,623,751 | 11/1986 | Kishi et al. | 136/244 |
| 4,889,565 | 12/1989 | Fan et al. | 136/256 |

FOREIGN PATENT DOCUMENTS 58-138080  8/1983  Japan .................. 136/256

OTHER PUBLICATIONS

*Solar Cells;* "Stable Silicon Solar Cells with High Temperature Survivability" by Tandon et al.; vol. 20, No. 3; Apr. 1987; pp. 177-186.

*Applied Physics Letters;* "Efficient AlGaAs Shallow-Homojunction Solar Cells" by Gale et al.; vol. 44, No. 6; Mar. 1984; pp. 632-634.

*Journal of the Electrochemical Society;* "Use of Plasma-Deposited $Si_3N_4$ as an Oxidation Mask in the Fabrication of GaAs Shallow-Homojunction Solar Cells"; by Turner et al.; vol. 131, No. 5; May 1984; pp. 1211-1213.

*IEEE Transactions on Electron Devices;* "Investigation of Titanium Nitride Layers for Solar Cell Contacts"; by Von Seefeld et al.; vol. ED.-27, No. 4; Apr. 1980; pp. 873-876.

Werthen, J. G. Hamacker, H. C., Virshup, G. F. Lewis, C. R., and Ford, C. W. "High Efficiency AlGaAs-GaAs Cassegrainan Contractor Cells" NASA Conference Publication 2408:61-68 (Apr. 30, 1985).

M. A. Nicolet and M. Bartur "Diffusion Barriers in Layered Contact Structures" J. Vac. Sci. Technol., vol. 19: 786 (1981).

(Abstract continued on next page.)

*Primary Examiner*—Aaron Weisstuch
*Attorney, Agent, or Firm*—Hamilton, Brook, Smith & Reynolds

[57] ABSTRACT

A photovoltaic device utilizing compound semiconductor materials that are stable when operated at high temperatures. Hostile environments, and in particular, thermally stressful environments such as those generated by use of light concentrating systems, require encapsulation of the device. Sealing of the photo-active junction, the conductive grid, the exposed semiconductor surfaces, and the pads contacting the grid away from the junction area provide such thermal stability. A heterojunction structure can be used along with barrier materials providing a conductive grid in contact with the photo-active surface thereby reducing interdiffusion of that surface with the conductive grid.

17 Claims, 4 Drawing Sheets

U.S. PATENT DOCUMENTS

Horne, W. E., et al., "High Temperature Contact Metallization for Advanced Solar Cells," Final Report on Contract AFWAL-TR-84-2044 AFWAL/POOC Wright Patterson Air Force Base, Ohio (Sep. 81-Apr. 84).

DeSalvo, Gregory C. Ervin H. Mueller, & Allen M. Barnett "N/P GaAs Concentrator Solar Cells w/an Improved Grid & Busbar Contact Design," NASA Conference Publication 2408:51–59 (Apr. 30-May 2, 1985).

Basore, P. A. "Optimum Grid-Line Patterns for Concentrator Solar Cells Under Nonuniform Illumination" *IEEE Photovoltaic Conference Record* 84CH2019-8: 637–642, (May 1-4, 1984).

M. F. Zhu et al., *Thin Solid Films*, vol. 119, pp. 5–9 (1984).

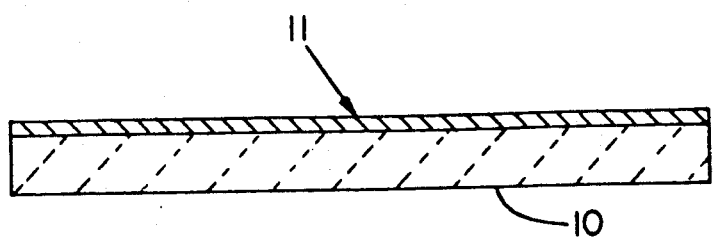
FIG. 1A
FIG. 1B
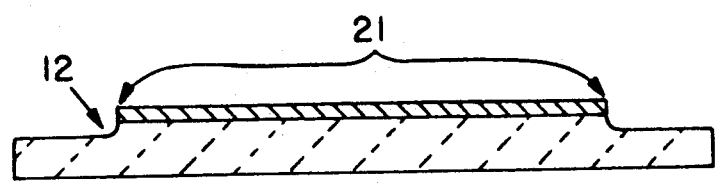
FIG. 1C
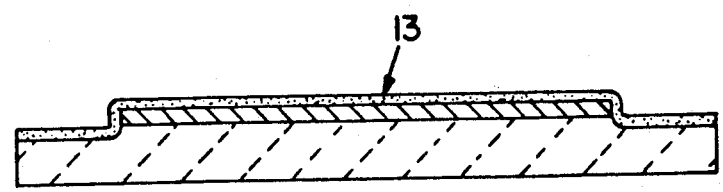
FIG. 1D
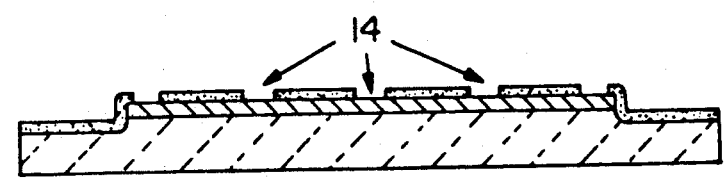
FIG. 1E
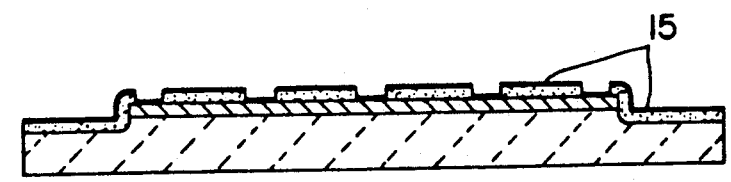
FIG. 1F
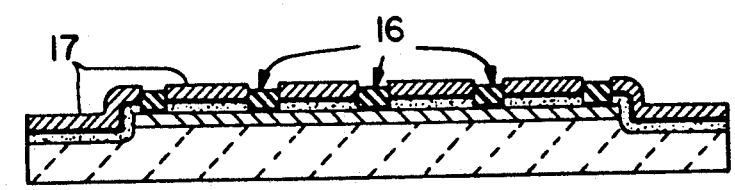
FIG. 1G
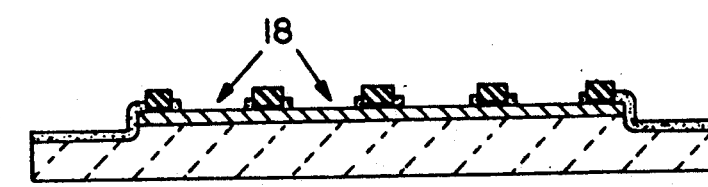
FIG. 1H
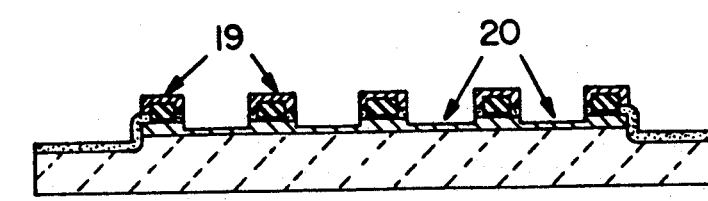

HIGH TEMPERATURE PHOTOVOLTAIC CELL

This is a continuation of co-pending application Ser. No. 07/658,443 filed on Feb. 21, 1991, now abandoned, which was a File Wrapper Continuation of U.S. Ser. No. 07/424,676 filed Oct. 20, 1989 now abandoned which was a Divisional of U.S. Ser. No. 07/087,459 filed Aug. 20, 1987 now issued as U.S. Pat. No. 4,889,565.

BACKGROUND

The use of photovoltaic devices with systems for concentrating sunlight onto these devices has resulted in the development of methods for optimizing the efficiency and lifetime of devices operating at elevated temperatures while minimizing the losses due to grid design. Concentrator systems often consist of cones, funnels, or lenses used to reflect a wide field of incident light onto a small focal plane where a solar cell is located. These cells are often used in space applications where thermal and radiation damage due to the environment can severly reduce cell lifetime and efficiency. Werthen, J. G., Hamaker, H. C., Virshup, G. F., Lewis, C. R., and Ford, C. W., "High-Efficiency AlGaAs-GaAs Cassegrainian Concentrator Cells," NASA Conferences Publication 2408:61-68 (Apr. 30, 1985); Amano, C., Yamaguchi, M., and Shibukawa, A., "Optimization of Radiation-Resistant GaAs Solar Cell Structures," *International PVSEC* 1: 845-848 (1987).

The interdiffusion of the material used as an electrical conductor with photo-active semiconductor materials from which current is collected has resulted in the development of diffusion barrier schemes to control the instability of adjacent layers. This interdiffusion, resulting in the breakdown of the structure and loss of efficiency, has plagued existing devices being operated at high temperatures. Many nitrides, borides, and carbides of early transition metals have been suggested for use as diffusion barriers with silicon. M-A. Nicolet and M. Bartur; "Diffusion Barriers in Layered Contact Structures," *J. Vac. Sci. Technol.*, 19: 786 (1981). The use of barriers to prevent the diffusion of a Au overlying contact layer into an ohmic contact metallized layer on GaAs wafers has been discussed in J. Shappirio, et al., *J. Vac. Sci. Technol.* A, 3: 2255(1985). The survivability of such metallized photovoltaic devices at temperatures up to 700° C. has been explored. These cells showed significant degradation when temperature tested at 700° C., especially when tested in a vacuum. See Horne, W. E., et al., "High Temperature Contact Metallizations for Advanced Solar Cells," Final Report on Contract AFWAL-TR-84-2044, AFWAL/POOC, Wright Patterson Air Force Base, Ohio (Sept. 1981-April 1984).

The grid pattern used in photovoltaic devices contains several loss mechanisms which reduce the available power output. It is desirable to reduce the grid area as the grid blocks out light that would otherwise enter the cell. This factor must be balanced against ohmic and surface recombination losses that are reduced with greater areal coverage by the grid contacts.

The area normally illuminated on a concentrator cell is circular in nature, with the power of the incident light decreasing radially from the center. Thus, the typical grid design for solar cell concentrators has a circular pattern with radial spokes in order to minimize power loss and maximize current collection. See Gregory C. DeSalvo, Ervin H. Mueller and Allen M. Barnett, "N/P GaAs Concentrator Solar Cells with an Improved Grid and Busbar Contact Design," NASA Conference Publication 2408:51-59 (Apr. 30-May 2, 1985); Basore, P. A., "Optimum Grid-Line Patterns for Concentrator Solar Cells Under Nonuniform Illumination," *IEEE Photovoltaic Conference Record* 84CH2019-8: 637-642 (May 1-4, 1984).

The use of gallium arsenide (GaAs) for solar cells, and of aluminum gallium arsenide (AlGaAs) double-heterostructures in particular, has been disclosed in U.S. Pat. No. 4,547,622 and other references cited therein. Different AlGaAs layers may be used to create a back surface field (BSF) to reflect electrons toward the p-n junction, and/or to reduce unwanted surface recombination.

Even with the many known device improvements, photovoltaic structures continue to suffer efficiency losses due to mechanical and thermal stresses encountered at elevated temperatures. Cells using compound semiconductors in particular, lose their structural and chemical integrity due to decomposition, especially at the higher operating temperatures often encountered with the use of concentrator systems.

SUMMARY OF THE INVENTION

The present invention relates to a photovoltaic structure and a method of making such a structure for use at high temperatures where certain materials are employed on the surface of the semiconductor to inhibit interdiffusion of these materials with the conductive contact. The cell is encapsulated with a material or materials having thermal stability and which operate to seal the entire device as well as the active junction area. These materials can also have suitable antireflective characteristics when covering the photo-active region. This system is well suited for use with concentrator systems which focus a wide field of radiation onto the photo-active surface of the cell which operates at elevated ambient temperatures.

A preferred embodiment of the invention employs grid lines which run off of the photo-active surface where they can be soldered or welded to the external contacts away from the junction area. This provides increased mechanical and thermal stability of the junction area and simplifies the sealing of the junction.

In one embodiment, the conductive grid is comprised of a refractory metal. In another embodiment, a metallized layer operates to provide a low resistance contact between the conductor and the compound semiconductor surface. At elevated temperatures, this structure inhibits diffusion and thus breakdown, while minimizing resistive losses created by separation of the conductive grid from the semiconductor surface. The resulting structure permits continuous use of the cell at ambient temperatures above 300° C.. When operated at such elevated temperatures, the device will self-anneal or become radiation hardened so that the photovoltaic structure will not significantly degrade under the operating conditions often found in a space environment.

Another preferred embodiment for more hostile, very high temperature applications utilizes a barrier or antidiffusion layer on top of the metallized contact layer to substantially reduce diffusion in the grid area. This layer can be any number of metals, preferably titanium tungsten nitride (TiWN) or titanium nitride (TiN), or others such as tungsten nitride (WN) and tantalum nitride (TaN), or alternating layers of these alloys. The barrier may also be comprised of other refractory nitrides or silicides. The thermal stability of these structures makes them suitable for any high temperature application in addition to use with concentrator systems.

The cell structure can be used with any suitable grid design or with any system for concentrating the incident light onto the cell, depending upon the particular application. Where the optical concentrator used with the above device creates approximately uniform illumination across the cell, alternatives to the traditional circular grid designs can maximize the cell output. One embodiment of the present invention discloses a minimized contact area with a linear grid pattern, or alternatively, a four quadrant split of the grid pattern, to optimize output.

The photovoltaic device used with the concentrator is produced using standard photolithography and deposition techniques used in integrated circuit manufacturing. The device is thus easily manufactured at tolerances yielding substantial improvements in performance under conditions of severe thermal stress.

The above and other features of the invention including various novel details of construction and combinations of parts will now be more particularly described with reference to the accompanying drawings and pointed out in the claims. It will be understood that the particular high temperature photovoltaic systems embodying the invention are shown by way of illustration only and not as a limitation of the invention. The principles and features of this invention may be employed in varied and numerous embodiments without departing from the scope of the invention.

BRIEF DESCRIPTION OF THE DRAWINGS

FIG. 1(A-H) schematically illustrates the fabrication stages of the method of making a device according to the invention;

DETAILED DESCRIPTION OF THE INVENTION

Figure 2:
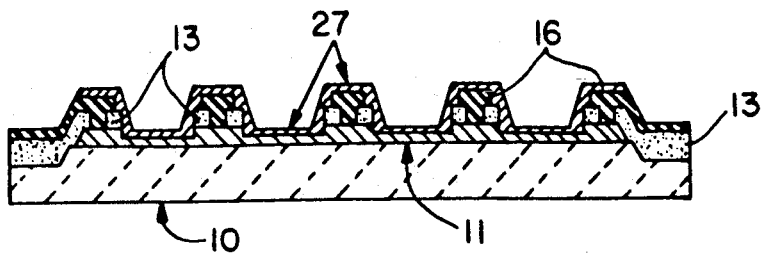
FIG. 2 schematically illustrates a cross section of one embodiment of a high temperature photovoltaic cell according to the invention.

The following high temperature cell design can be fabricated using standard semiconductor fabrication techniques. A masked set of photographic plates containing images of the pattern required at the different stages of the fabrication process illustrated in FIG. 1 can be produced.

A wafer 10 of suitably doped Gallium Arsenide (GaAs) must be prepared with an appropriate diode structure 11 (FIG. 1A). A suitable structure, for example, can consist of a classical n+/p/p+ shallow homojunction structure. As disclosed in U.S. Pat. No. 4,227,941 a GaAs solar cell can have such a structure with a 1 micron thick p+ layer on a p+ bulk GaAs wafer. This is followed by a 3.5 micron thick p layer and an n+ layer that is 1500 to 2000 Å thick and sulfur or selenium doped at $5 \times 10^{18}$ cm$^{-3}$.

In one embodiment, the wafer 10 and structure 11 are patterned with photoresist, such that a circular area is covered for each cell on the wafer. The wafer is then etched (FIG. 1(B)) in a peroxide/hydroxide solution to a depth 12 below the level of the junction. The mesas 21 are now isolated diodes, each of which will become the active area of the final cell. FIG. 1(C) shows the wafer 10 coated with an insulating layer 13. Numerous insulators and deposition techniques can be employed. This layer 13 acts to encapsulate the junction area 21 and isolates the semiconductor surface from subsequent metal layers. The wafer is again patterned with photoresist, and the nitride or insulating layer is etched away as above in FIG. 1(D) where the areas 14 of the subsequent metal pattern will contact the wafer.

In a preferred embodiment, these contact areas 14 or windows can be made small (on the order of 3×5 microns) to minimize surface recombination in critical applications where maximum efficiency is required. The smaller window size also reduces the area where interdiffusion with the conductive grid material can occur, especially where a diffusion barrier is not used. Alternatively, the windows can be made to run the entire length of the grid pattern in less critical applications.

Of critical importance to high temperature operations is the conductive material used to collect the photocurrent and the method of contacting this material to a compound semiconductor surface. This is addressed by coating the wafer 10 with a metal layer 15 or, alternatively, with both a metal layer and a diffusion barrier (FIG. 1(E)), which are preferably very thin. These layer(s) are designed to withstand high temperatures and to make a low resistance contact to the cell, but do not necessarily have to carry large amounts of current. A current carrying metal layer 16 on top of the metallized or diffusion barrier layer 15 shown in FIG. 1(F) is used for this purpose. The use of refractory metals as conductors has improved the performance of the collecting grid at these elevated temperatures. This performance is further improved in high temperature applications by incorporating a diffusion barrier into the cell design to avoid conductor-semiconductor interdiffusion.

The thickness of the conductive layer can be increased for applications where large amounts of current must be carried. For example, concentrators generating several hundred suns of illumination would require a high current capacity.

To form the grid, the wafer 10 is masked 17 for a third time and a conducting grid pattern 16 is placed on top of the previous layer 15. The resist 7 is then stripped in FIG. 1(G), revealing the grid pattern undercoated by the high temperature metal system 15. Since the high temperature metal system covers the cell, it must be removed everywhere except underneath the conductor 16. To accomplish this task, the wafer is sputter etched. In this process, a portion of the conductor 16 is removed as well as the metallized layer 15 not covered by conductor grid 16. Since the conductor 16 is many times thicker than the high temperature metal 15, the grid pattern remains intact after the process. In FIG. 1(H) the conductor may be enclosed with insulator 19. The top layer of the diode structure (the n+ layer in the case of a shallow homojunction) is etched or thinned 20 so that carriers are located as close to the active junction as possible to maximize the cell's I-V characteristics.

In a preferred embodiment of the invention illustrated in FIG. 1, the metallization scheme consists of a thin tungsten (W) layer that is 300 to 400 Å thick, which is electron beam deposited or sputtered onto the patterned wafer. Tungsten is preferred because of its good conductivity and due to the good match of its coefficient of thermal expansion with that of GaAs. This is followed by a TiWN diffusion barrier layer. The thickness of the barrier layer is preferably around 300–1000 Å thick. The thickness of the diffusion layer should be kept at a minimum due to the mechanical stress caused by the refractory nitride in use. The refractory nitrides are best deposited by sputtering at low power to minimize sputtering damage to the GaAs surface. The top metallization can be nickel and the whole structure should then be covered by a capping layer, preferably $Si_3N_4$. In one embodiment, this structure is then annealed by rapid thermal annealing to about 500°–700° C. This step anneals off fabrication damage in the cell such as sputtering damage.

Other materials may be used instead of the tungsten for metallization, such as Mo, Ni, Ti, tungsten alloys or Ta. Alternatively, silicides such as tungsten silicide or molybdenum silicide can be used. However, for cells operating at less than 100 suns a refractory metal such as W, in a layer about 2000°–5000° A. thick, can be used as a conductor without any metallization layer or diffusion barrier layer. This latter embodiment provides a simpler but thermally stable system at lower incident power levels.

FIG. 2 illustrates a cross section of a preferred embodiment of a high temperature cell with a five finger conductor pattern. Note that no metallized or barrier layer is found in this embodiment. Where the conductor 16 is a refractory metal, such as W or Mo or a refractory silicide such as $WSi_2$ or $MoSi_2$, the thermal stability of this structure permits the omission of a diffusion barrier in certain applications. An antireflection coating 27, preferably silicon nitride, is applied to generate high efficiencies for the solar spectrum anticipated. In this embodiment, the coating serves to encapsulate the active area of the cell further limiting diffusion and decomposition of the structure elements. Non-illuminated surfaces can be sealed with an insulator. The conductors 16 are shown as extending off the junction area 11. This permits the contacts to the conductive grid to be made away from the junction area, thereby reducing the thermal and mechanical stresses often encountered when contacting the grid in the junction area. Bonding off of the junction area is even more preferable at high temperatures to minimize interdiffusion and other deleterious effects.

Figure 3:
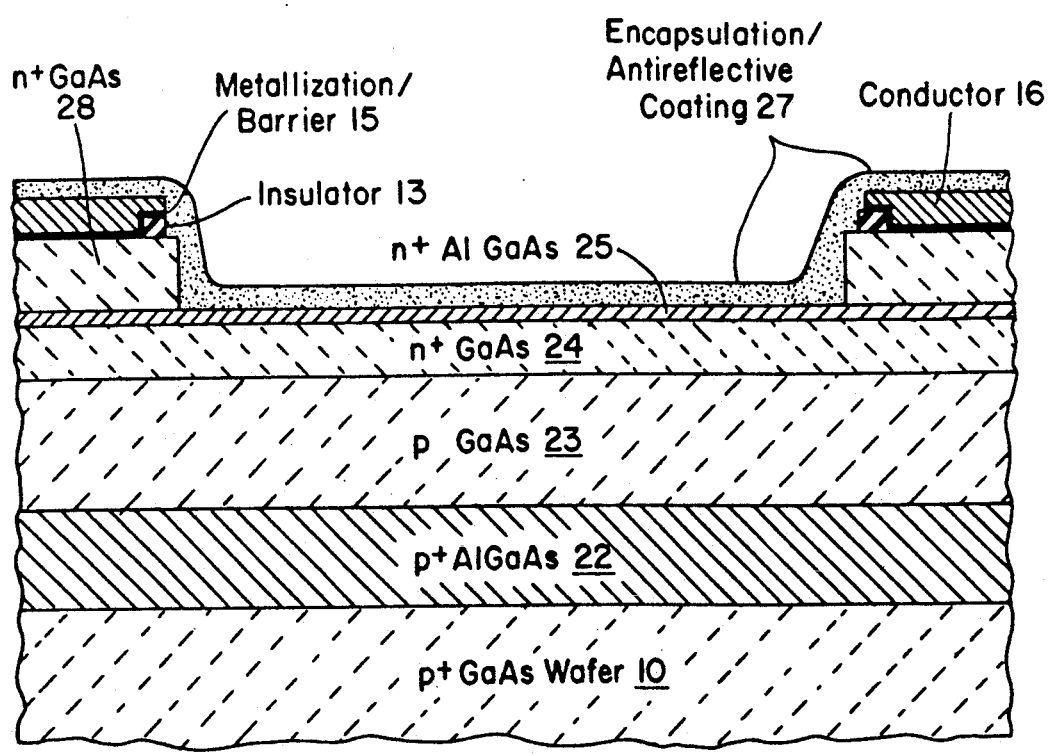
FIG. 3 illustrates a cross section of a hetero-junction structure of AlGaAs and GaAs.

To get higher efficiencies, another preferred embodiment utilizes the heterojunction structure illustrated in FIG. 3. This begins with a high quality p+ wafer 10 covered by a 1 to 2 micron thick AlGaAs p+ layer 22. The p layer 23 should be doped at approximately $10^{17}$ to $10^{18}$ cm$^{-3}$ for concentrator cells and be 2.5 microns to 5 microns thick. The n+ GaAs layer 24 is preferably less than 0.25 microns thick with a doping level of 1 to $3 \times 10^{18}$ cm$^{-3}$. An n+ AlGaAs cap layer 25 of 100°–500° A° is then deposited over the n+ GaAs layer primarily for surface passivation. The Al content should be high, that is, greater than 80%. The contact layer 28 of n+ GaAs is then deposited with a doping level of over $5 \times 10^{18}$ cm$^{-3}$. This "pillar" type structure can be about 0.1–0.5 microns thick and results in further separation of the metallic contact from the junction area. The structure will provide about 15 relative percentage points over the shallow homojunction structure efficiency. As it is unnecessary to thin the top n+ layer as in the homojunction structure, the processing for this structure is simpler and more reproducible. The radiation hardness of these structures can also be improved by adding aluminum at concentrations of less than 10% to each of the GaAs layers. The cell structure of FIG. 3 can be used with or without a concentrator system, as any application requiring high temperature survivability is appropriate.

A further embodiment similar to that illustrated in FIG. 3 utilizes a double heterojunction structure. This structure has a p+ wafer of GaAs covered with a layer of p+ AlGaAs with approximately 20% aluminum. This is followed by a layer of p GaAs and a layer of n+ AlGaAs added on top of the p GaAs layer to provide the double hetero-junction. The n+ AlGaAs layer is then followed by the "pillar" type structure of n+ GaAs. In this structure, the active junction is now between the n+ AlGaAs and the p GaAs.

Returning to FIG. 3, the insulator 13, as in FIGS. 1 and 2, is used to define the area over which the conductor 16 is in conductive contact with pillar 28 through the layer 15. The layer 15 is comprised of a metallization layer to provide a low resistance contact with the pillar surface 28, and a barrier layer to reduce interdiffusion between the conductor and the GaAs structure. The structure is encapsulated with layer 27. The layer 27 is an antireflective coating over the photo-active surface of the cell together with a sealing layer which is opened up for bonding at the off-mesa contact to the conductor grid.

Figure 4:
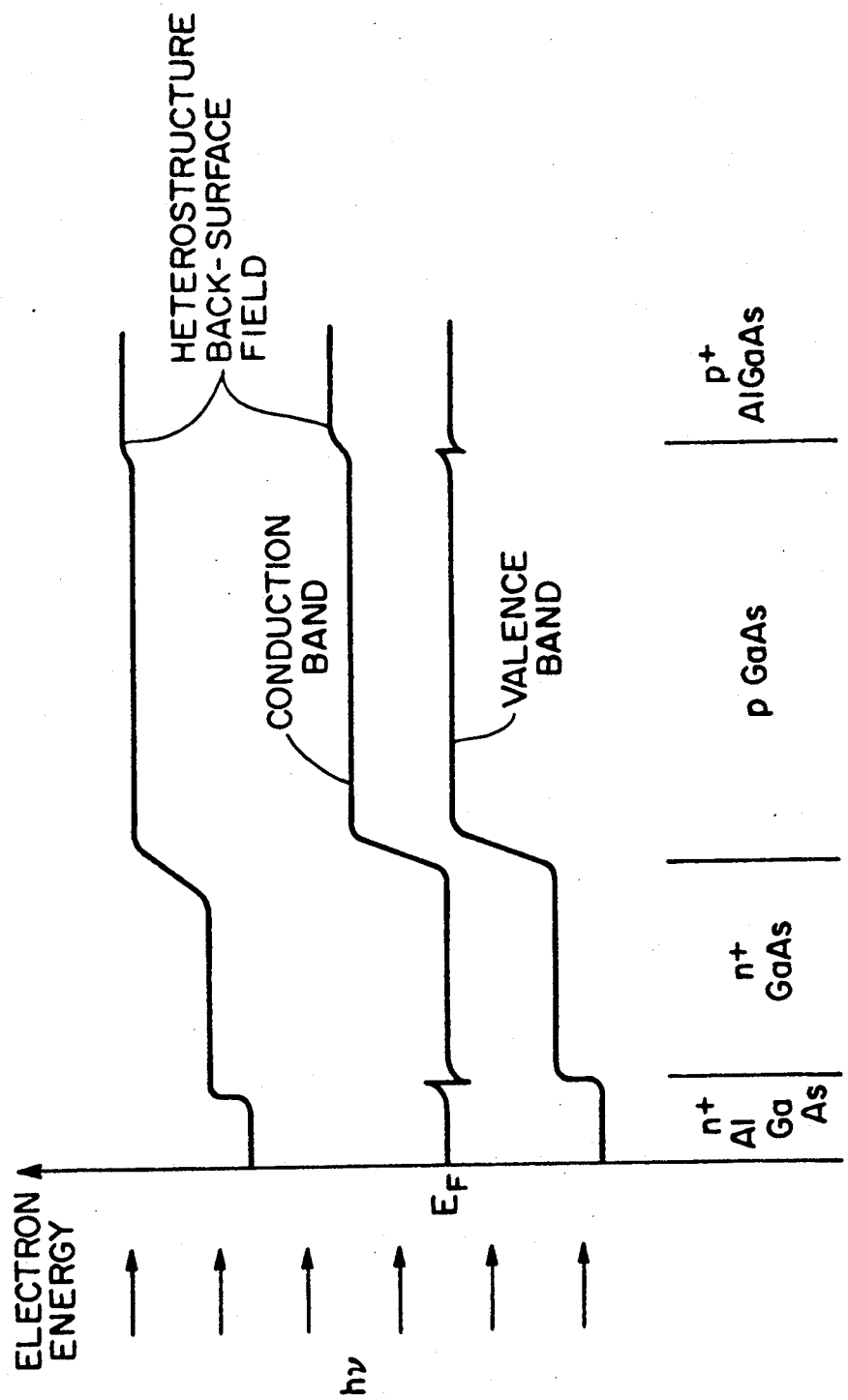
FIG. 4 schematically illustrates an energy band diagram for the heterojunction structure of FIG. 3.

FIG. 4 schematically depicts an energy band diagram for the heterojunction structure of FIG. 3. The heterojunction between the p+ AlGaAs layer 22 and the p GaAs layer 23 provides a back surface field which acts as a minority carrier mirror to efficiently reflect electrons back toward the p-n junction. The top AlGaAs layer 25 operates reduce the surface recombination velocity. The interface between materials of different bandgaps, as provided by these heterojunctions, provides a more abrupt interface than when simply altering the doping profile. The back surface field should preferably have a barrier height of approximately 3 KT or greater where K is Boltzmann's constant and T is the temperature in degrees Kelvin.

Although the structure described uses GaAs as the active layer, other compound semiconductors such as indium phosphide or gallium alluminum arsenide can be successfully used.

Figure 5:
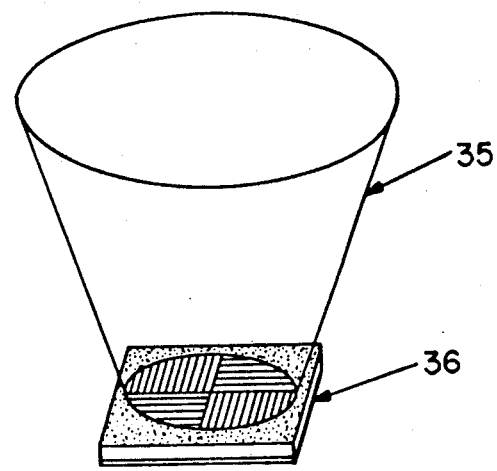
FIG. 5 illustrates a light funnel with the concentrator cell.

FIG. 5 shows schematically how a light funnel 35 may be used in concentrating and distributing incident light more uniformly across a cell 36.

Figures 6A, 6B:
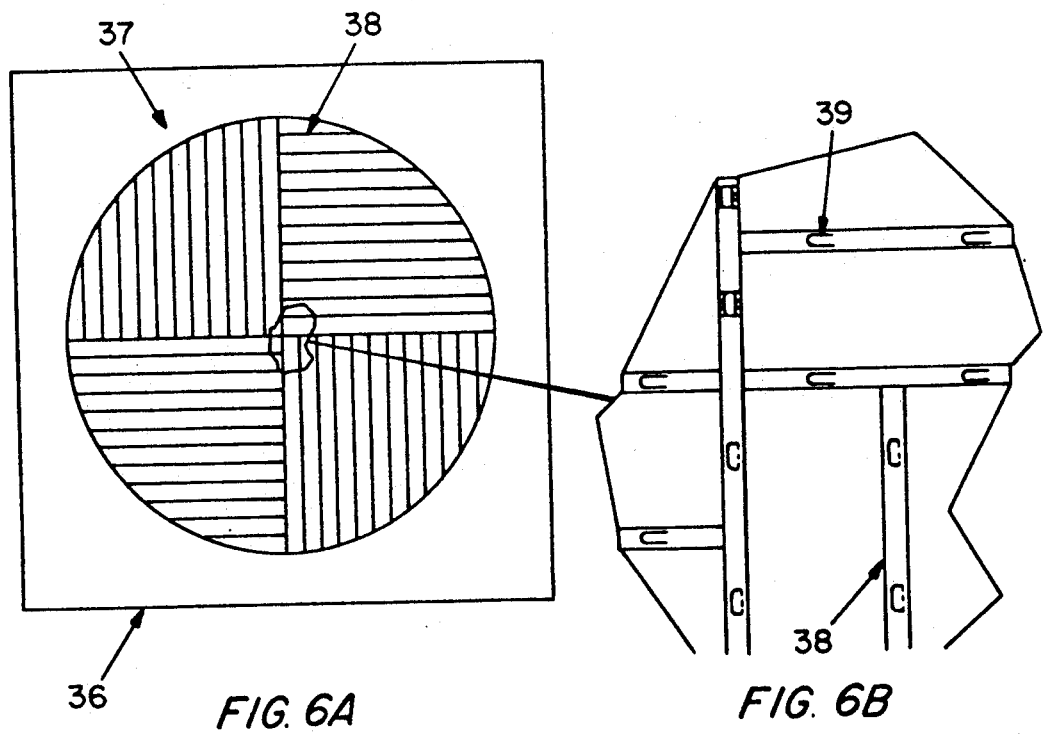
FIG. 6(A) schematically illustrates a four quadrant grid pattern and 6(B) illustrates the small contact design of 6(A) in an exploded view.

FIG. 6A illustrates the four quadrant design 37 with a magnified view of where the four quadrants meet in FIG. 6B. The magnified view shows a particular contact pattern 38 with the small rectangular windows 39 distributed along each line of the grid.

This pattern (6A) is preferred because it is easier to fabricate than conventional designs which have radial symmetry. Illumination of a conventional light concentrating system has a radial distribution, and thus the current output of the cell varies radially. In order to accomodate this, previous concentrator grid designs were radial. Under the present concentrator design the light intensity distribution is very uniform and the desire to have radial symmetry in the grid pattern loses its supposed advantage. Note that the cell design of FIG. 3 can be used with radially illuminating concentrator systems, or any other illuminating geometry as long as the grid pattern is chosen accordingly.

The cell contact pattern can be divided into four quadrants. Each quadrant consists of straight parallel lines of conductor material partially insulated from the semiconductor surface by an insulating material. The conductor paths 38 reach from the edge of the photo-active surface to the border of the quadrants. The conductor is contacted off of the photo-active surface: i.e., the conductor extends off of the cell surface to the side 37 of the junction area. By contacting the cell conductor off of the mesa, or junction area, (21 of FIG. 1B), the mechanical and thermal stresses caused by contacting the grid on the mesa are minimized. This off-mesa contact to the grid is more important when operating temperatures are high or when periodic thermal excursions above routine operating temperatures can produce stress in the junction area.

The insulator pattern contains windows 39 which define the contact area between the conductor lines and the semiconductor surface of the cell. By adjusting the size of these contact windows, one can control the level of surface recombination of minority carriers. Reducing the window size reduces the rate of surface recombination thereby improving the overall efficiency of the cell. In applications where high efficiencies are less critical, the insulator windows may extend the entire length of the conductor line across the cell quadrant. Where higher efficiencies are needed, the windows may be reduced in size and evenly spaced along the conductor lines without significant offsetting losses due to longer current paths. More importantly, the use of windows in the contacting grid will further reduce the conductor contact area with the semiconductor surfaces to further reduce the possible interdiffusion effects occurring at high temperatures.

The above structure and design provides solar cells that are stable during high temperature operation above 300°–400° C. In addition, for space applications, these cells can anneal off radiation damage normally incurred in space when operated in this temperature range.

The above design can be used in conjunction with the so-called "CLEFT" peeled film technology in PCT/US81/00439 (corresponding to U.S. Pat. No. 4,727,047, filed Apr. 6, 1987, a Continuation-in-Part of U.S. Ser. No. 138,891, filed Apr. 10, 1980) which is incorporated herein by reference. This thin, lightweight structure permits use of the structure in tandem or with a back reflective contact to improve collection of minority carriers within the active layer.

Those skilled in the art will recognize, or be able to ascertain using no more than routine experimentation, many equivalents to the specific embodiments of the invention described herein. Other compound materials such as InP or GaAlAs, that are useful as photovoltaic materials, can be used in the claimed structure. Such equivalents are intended to be encompassed by the following claims.

We claim:

1. A photovoltaic device comprising:
   a single crystal compound semiconductor region having a light incident surface on a mesa structure, the region including an n-doped layer having an active junction with a p-doped layer, the active junction extending across a plane parallel to said light incident surface;
   a conductive metallized layer making a low resistance contact with the light incident surface on one side of the junction;
   a diffusion barrier covering said metallized layer;
   a conductor in conductive contact with the light incident surface via said metallized layer and diffusion barrier; and
   at least one encapsulating layer provided such that the semiconductor region, conductor, and junction are encapsulated by the encapsulating layer to reduce diffusion of material from the compound semiconductor.

2. The photovoltaic device of claim 1 wherein said encapsulating layer or layers encapsulates substantially all of the device such that no semiconductor surface is exposed.

3. The photovoltaic device of claim 1 wherein said conductor comprises a refractory metal silicide.

4. The photovoltaic device of claim 1 wherein said conductor comprises a refractory metal.

5. The photovoltaic device of claim 1 wherein said encapsulating layer comprises an antireflective layer that reduces reflection by the light incident surface.

6. The photovoltaic device of claim 1 wherein said encapsulating layer comprises an insulator.

7. An encapsulated photovoltaic device comprising:
   an n-doped region of gallium arsenide having an active junction with a p-dope region of gallium arsenide, the active junction lying within a mesa structure and extending across a plane parallel to a light incident surface;
   a conductor in conductive contact with a surface of one of the doped regions of gallium arsenide;
   a diffusion barrier positioned between the conductor and the contacted region of gallium arsenide to reduce diffusion between the gallium arsenide and the conductor; and
   an encapsulating layer to encapsulate a perimeter of the junction, the regions of gallium arsenide, and the conductor such that the diffusion from the gallium arsenide regions about the junction is reduced.

8. The encapsulated photovoltaic device of claim 7 further comprising a metallized layer positioned between the diffusion barrier and the contacted region of gallium arsenide, the metallized layer having a low contact resistance with the gallium arsenide surface.

9. The encapsulated photovoltaic device of claim 8 wherein the metallized layer comprises a refractory metal.

10. The encapsulated photovoltaic device of claim 8 wherein said metallized layer comprises a refractory metal silicide.

11. The encapsulated photovoltaic device of claim 8 wherein said metallized layer comprises a plurality of layers of refractory metals.

12. The encapsulated photovoltaic device of claim 7 wherein said conductor comprises a refractory metal silicide.

13. The encapsulated photovoltaic device of claim 7 wherein the encapsulating layer comprises an antireflective layer that reduces reflection by the gallium arsenide surface within a predetermined range of wavelengths.

14. The encapsulated photovoltaic device of claim 13 wherein said antireflective layer comprises silicon nitride.

15. The encapsulated photovoltaic device of claim 7 wherein said diffusion barrier is selected from the group consisting of TiWN, TiN, WN, and TaN.

16. The encapsulated photovoltaic device of claim 7 wherein said conductor is selected from the group consisting of Au, Ni, Pt, and Ag.

17. A solar cell comprising:
a single crystal semiconductor wafer having a mesa structure, a light incident semiconductor surface extending across the mesa and including an n-doped compound semiconductor layer having an active junction with a p-doped compound semiconductor layer,
a grid conductor in conductive contact with the semiconductor surface;
a diffusion barrier positioned between the conductor and the semiconductor surface; and
means for encapsulating said mesa, including the n and p doped semiconductor layers, the junction at the periphery of the mesa, and conductor such that the device operates at temperatures above 300° C. with substantially reduced diffusion from the n and p doped semiconductors.

* * * * *